United States Patent
Lv

(10) Patent No.: US 12,107,309 B2
(45) Date of Patent: Oct. 1, 2024

(54) IMPEDANCE MATCHING DEVICE AND COMMUNICATION DEVICE

(71) Applicant: Outdoor Wireless Networks LLC, Claremont, NC (US)

(72) Inventor: Fusheng Lv, Suzhou (CN)

(73) Assignee: Outdoor Wireless Networks LLC, Claremont, NC (US)

( * ) Notice: Subject to any disclaimer, the term of this patent is extended or adjusted under 35 U.S.C. 154(b) by 0 days.

(21) Appl. No.: 18/689,510

(22) PCT Filed: Aug. 30, 2022

(86) PCT No.: PCT/US2022/075624
§ 371 (c)(1),
(2) Date: Mar. 6, 2024

(87) PCT Pub. No.: WO2023/056147
PCT Pub. Date: Apr. 6, 2023

(65) Prior Publication Data
US 2024/0266702 A1  Aug. 8, 2024

(30) Foreign Application Priority Data
Sep. 28, 2021 (CN) .......................... 202111139780.4

(51) Int. Cl.
*H01P 1/00* (2006.01)
*H01P 3/08* (2006.01)

(52) U.S. Cl.
CPC . *H01P 1/00* (2013.01); *H01P 3/08* (2013.01)

(58) Field of Classification Search
CPC ..................................... H01P 1/00; H01P 3/08
See application file for complete search history.

(56) References Cited

U.S. PATENT DOCUMENTS

| | | | | |
|---|---|---|---|---|
| 5,808,529 A | * | 9/1998 | Hamre | H05K 1/0219 333/260 |
| 2005/0128022 A1 | * | 6/2005 | Ulm | H01P 1/268 333/22 R |
| 2011/0025429 A1 | | 2/2011 | Syal | |
| 2014/0077896 A1 | * | 3/2014 | Lee | H03H 7/17 333/185 |

(Continued)

OTHER PUBLICATIONS

International Search Report and Written Opinion for PCT/US2022/075624 mailed Dec. 20, 2022, 10 pages.

*Primary Examiner* — Samuel S Outten
(74) *Attorney, Agent, or Firm* — Myers Bigel, P.A.

(57) ABSTRACT

An impedance matching device includes a first dielectric substrate; a first transmission line circuit; a first conductive pad which extends toward the first transmission line circuit on the first dielectric substrate to at least partially vertically overlap the first transmission line circuit: a first reference potential layer; and a first matching load which is electrically connected to the first conductive pad and has a first resistance. An area where the first conductive pad vertically overlaps the first transmission line circuit has a size configured such that a load reactance associated with the first transmission line circuit is equal to or less than a predetermined threshold and an absolute value of a difference between a load resistance associated with the first transmission line circuit and the first resistance is equal to or less than a predetermined resistance threshold.

19 Claims, 4 Drawing Sheets

(56) References Cited

U.S. PATENT DOCUMENTS

2016/0134260 A1    5/2016   Bhutta et al.
2016/0322942 A1   11/2016   Lang et al.
2017/0162368 A1    6/2017   Marakhtanov et al.
2020/0321690 A1   10/2020   Paulotto et al.

* cited by examiner

ID/A/NCE MATCHING DEVICE AND
COMMUNICATION DEVICE

CROSS-REFERENCE TO RELATED APPLICATION

The present application is a 35 U.S.C. § 371 national phase application of PCT Application No. PCT/US2022/075624, filed Aug. 30, 2022, which claims priority to Chinese Patent Application No. 202111139780.4, filed Sep. 28, 2021, the entire contents of which are incorporated herein by reference as if set forth fully herein.

FIELD

The present disclosure generally relates to a field of communication technology, and more specifically, to an impedance matching device and a communication device.

BACKGROUND

Impedance matching is a basic and critical part in designs of many communication devices. Good impedance matching can enable basically all signals to be delivered to a load as expected, and almost no signal will be reflected back, thereby improving communication performance. For example, good impedance matching can impart better directivity in a directional coupler. Or, good impedance matching can also reduce crosstalk and the like in communication devices. In the state of impedance matching, the characteristic impedance of a transmission line and the load impedance associated with the transmission line are equal to each other and have the same phase. However, in practice it may be difficult to achieve a good impedance matching state. Therefore, there is a demand for improving impedance matching.

SUMMARY

According to a first aspect of the disclosure, an impedance matching device is provided, and the impedance matching device includes: a first dielectric substrate; a first transmission line circuit, which is provided on a first side of the first dielectric substrate, a first end of the first transmission line circuit being configured to receive a first signal; a first conductive pad, which is electrically connected to a second end of the first transmission line circuit and extends toward the first transmission line circuit on a second side opposite to the first side of the first dielectric substrate so as to at least partially vertically overlap the first transmission line circuit; a first reference potential layer, which is provided on the second side of the first dielectric substrate and separated from the first conductive pad by a first gap; and a first matching load, which is electrically connected to the first conductive pad and has a first resistance value; wherein a first vertical overlap area where the first conductive pad vertically overlaps the first transmission line circuit has a size configured such that a load reactance value associated with the first transmission line circuit is equal to or less than a predetermined reactance threshold and an absolute value of a difference between a load resistance value associated with the first transmission line circuit and the first resistance value is equal to or less than a predetermined resistance threshold.

According to a second aspect of the present disclosure, a communication device including the aforementioned impedance matching device is provided.

Figure 1:
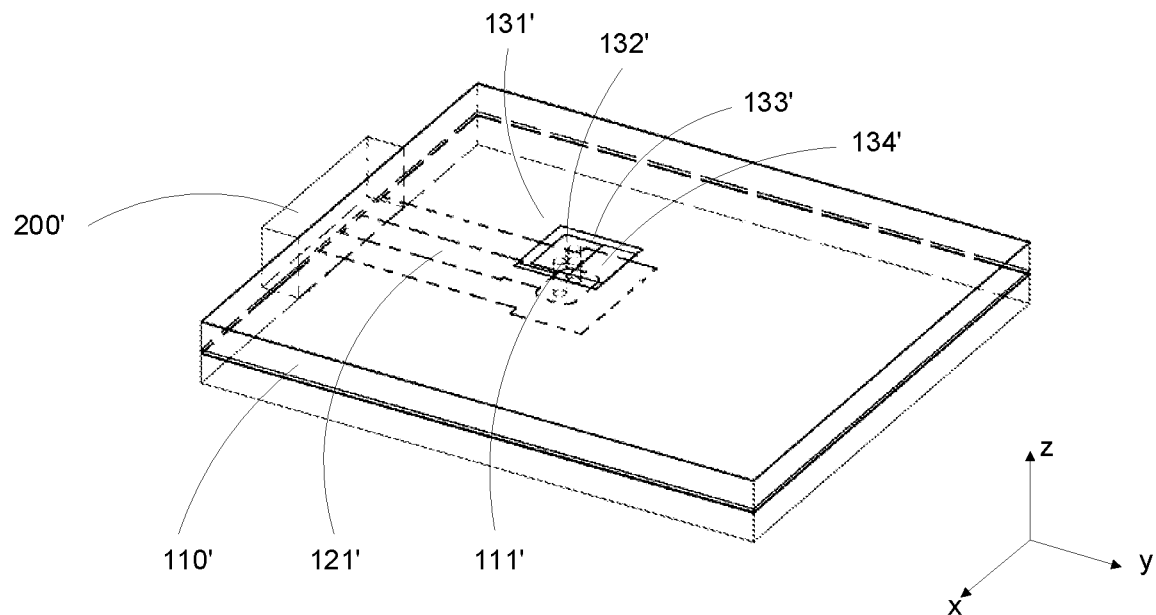
FIG. 1 shows a schematic perspective view of a communication device.

Note that invisible parts located inside or on the back are depicted with dashed lines in the drawings. In the embodiments described below, under some circumstances, the same signs are used among different drawings to indicate the same parts or parts with the similar functions, and repeated description is thus omitted. In some cases, similar labels and letters are used to indicate similar items. Therefore, once an item is defined in one attached drawing, it does not need to be further discussed in subsequent attached drawings.

For ease of understanding, the position, dimension, and range of each structure shown in the attached drawings and the like may not indicate the actual position, dimension, and range. Therefore, the present disclosure is not limited to the positions, dimensions, and ranges disclosed in the attached drawings and the like.

DETAILED DESCRIPTION

Various exemplary embodiments of the present disclosure will be described in detail below by referencing the attached drawings. It should be noted: unless otherwise specifically stated, the relative arrangement, numerical expressions and numerical values of components and steps set forth in these embodiments do not limit the scope of the present disclosure.

The following description of at least one exemplary embodiment is actually only illustrative, and in no way serves as any limitation to the present disclosure and its application or use. In other words, the structure and method herein are shown in an exemplary manner to illustrate different embodiments of the structure and method in the present disclosure. Those of ordinary skill in the art should understand that these examples are merely illustrative, but not in an exhaustive manner, to indicate the embodiments of the present disclosure. In addition, the drawings are not necessarily drawn to scale, and some features may be enlarged to show details of some specific components.

The technologies, methods, and equipment known to those of ordinary skill in the art may not be discussed in detail, but where appropriate, the technologies, methods, and equipment should be regarded as part of the specification.

In all examples shown and discussed herein, any specific value should be construed as merely exemplary value and not as limitative value. Therefore, other examples of the exemplary embodiments may have different values.

Figure 2:
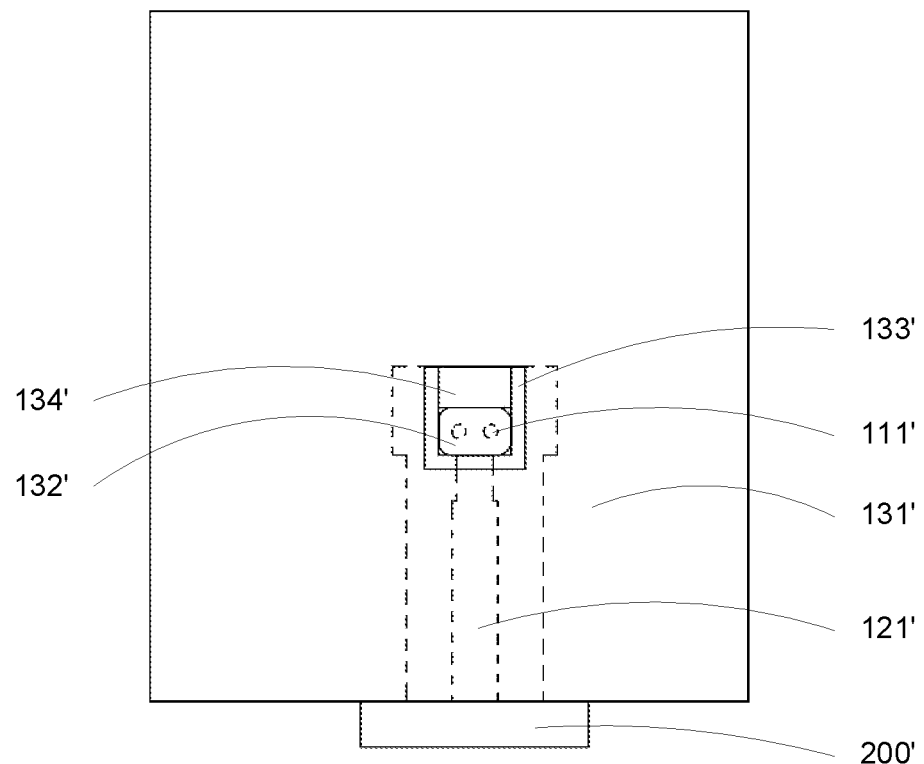
FIG. 2 shows a schematic top view of the communication device in FIG. 1.

As shown in FIG. 1 and FIG. 2, a communication device may include a source device 200' capable of outputting signals and an impedance matching device. The impedance matching device may include a dielectric substrate 110', a transmission line circuit 121' located on a first side of the dielectric substrate 110' and a reference potential layer 131' (e.g., a ground layer) located on a second side opposite to the first side of the dielectric substrate 110', a conductive pad 132' and a matching load 134'. A conductive through hole 111' may be provided in the dielectric substrate 110' to electrically connect the transmission line circuit 121' and the conductive pad 132' respectively located on two sides, which are opposite to each other, of the dielectric substrate 110'. A gap 133' may be provided between the reference potential layer 131' and the conductive pad 132' so as to prevent the reference potential layer 131' from being short-circuited with the conductive pad 132'. In addition, the matching load 134' may be connected between the conductive pad 132' and the reference potential layer 131'. In the impedance matching device, a signal from the source device 200' may enter the impedance matching device from one end of the transmission line circuit 121', be transmitted along the transmission line circuit 121', and reach the matching load 134' via the conductive through hole 111' and the conductive pad 132' to be absorbed by the matching load 134'.

In order to avoid signal reflection, load impedance associated with the transmission line circuit 121' should match the characteristic impedance of the transmission line circuit 121', that is, the load impedance and the characteristic impedance are equal to each other in magnitude and have the same phase. According to FIG. 1 and FIG. 2, the load impedance may be related to the conductive pad 132', the matching load 134' and other components. In some cases, target load impedance may have a resistance component of 50 ohms and a zero reactance component. Correspondingly, the matching load 134' may be a 50 ohm resistor connected between the conductive pad 132' and the reference potential layer 131'.

However, in the impedance matching device shown in FIG. 1 and FIG. 2, due to the capacitive effect between the conductive metal layers (including the transmission line circuit 121' and the reference potential layer 131') on two sides of the dielectric substrate 110', the reactance component of the actual load impedance may not be zero, but a certain amount of capacitive resistance may exist. In order to offset the influence of this part of capacitive reactance, in some cases, the width of the conductive pad 132' in an extension direction (x direction) perpendicular to the transmission line circuit 121' may be changed to introduce a certain inductive effect, so that the reactance component of the load impedance is adjusted to zero. However, when the width of the conductive pad 132' is changed, the resistance value of the conductive pad also changes, resulting in a change in the resistance component of the load impedance associated with the transmission line circuit 121', that is, no longer equal to 50 ohms. In other words, in the process of adjusting impedance matching, it is difficult to independently adjust the resistance component and the reactance component separately, and thus it is difficult to achieve ideal impedance matching.

Figure 3:
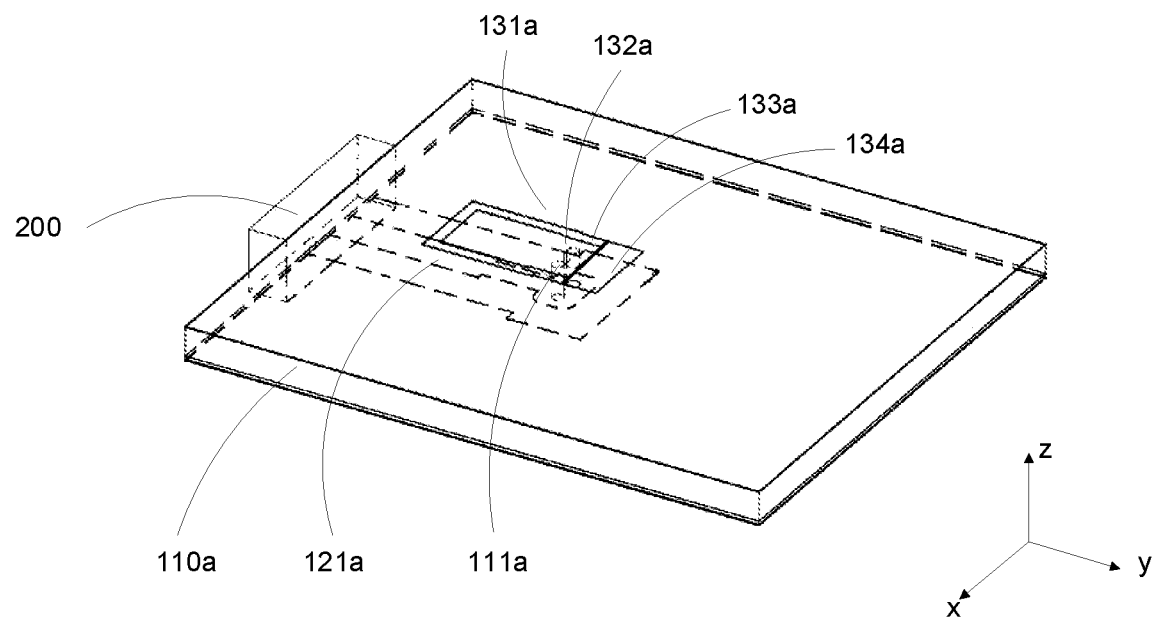
FIG. 3 shows a schematic perspective view of a communication device according to a first exemplary embodiment of the present disclosure.
Figure 4:
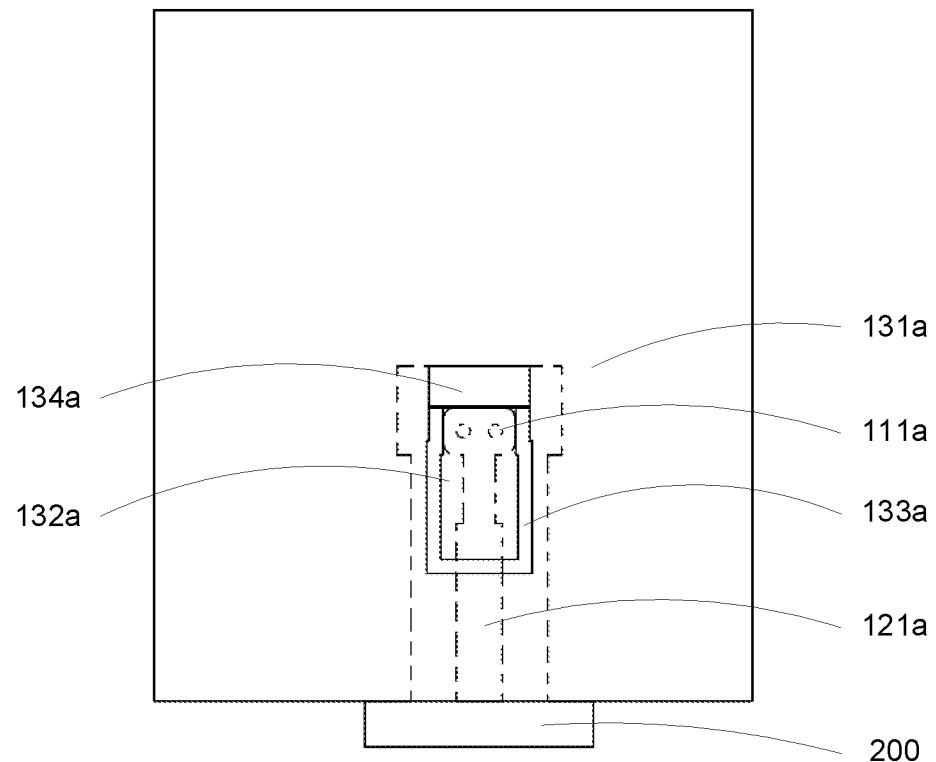
FIG. 4 shows a schematic top view of the communication device in FIG. 3.

In order to solve the aforementioned problem, the present disclosure proposes an impedance matching device and a communication device including the impedance matching device. As shown in FIG. 3 and FIG. 4, in a first exemplary embodiment of the present disclosure, an impedance matching device may include a first dielectric substrate 110$a$, a first transmission line circuit 121$a$ provided on a first side of the first dielectric substrate 110$a$, a first conductive pad 132$a$ and a first reference potential layer 131$a$ (for example, a ground layer) provided on a second side opposite to the first side of the first dielectric substrate 110$a$, and a first matching load 134$a$ which may be provided on the second side of the first dielectric substrate 110$a$. In order to achieve good grounding, the first reference potential layer 131$a$ may cover all or substantially all of the second side of the first dielectric substrate 110$a$ except, for example, the region where the first conductive pad 132$a$ and the first matching load device 134$a$ are provided. In addition, a conductive through hole 111$a$ may be provided in the first dielectric substrate 110$a$ that electrically connects the first transmission line circuit 121$a$ and the first conductive pad 132$a$.

A first signal from a source device 200 may enter the impedance matching device from a first end of the first transmission line circuit 121$a$, and pass through the first transmission line circuit 121$a$, the conductive through hole 111$a$ and the first conductive pad 132$a$ in this order to reach the first matching load 134$a$. In some embodiments, the first matching load 134$a$ may have a first resistance value, which may be set to be equivalent to the resistance component of the characteristic impedance of the first transmission line circuit 121$a$. In an example embodiment, the first resistance value may be 50 ohms. The first matching load 134$a$ (or other matching loads mentioned below) may be a first matching resistor, a first radiating element, or other load devices, which may be set according to needs. In the following text, technical solutions of the present disclosure will be described in detail using an example in which the matching load is a matching resistor. Moreover, when the first matching load 134$a$ is a first matching resistor, it may be connected between the first conductive pad 132$a$ and the first reference potential layer 131$a$.

In addition, a first gap 133$a$ may be provided between the first reference potential layer 131$a$ and the first conductive pad 132$a$ in order to avoid a short-circuit forming therebetween.

As described above, in the impedance matching device shown in FIG. 3 and FIG. 4, the conductive metal layers on two sides of the first dielectric substrate 110$a$ may exhibit a capacitive effect. In order to counteract the capacitive effect, the first conductive pad 132$a$ may be made to extend toward the first transmission line circuit 121$a$ on the second side of the first dielectric substrate 110$a$ so as to at least partially vertically overlap the first transmission line circuit 121$a$. Herein, a first element of an impedance matching device that includes a transmission line circuit on a dielectric substrate "vertically overlaps" a second element if an axis that is perpendicular to a major surface of the dielectric substrate (i.e., an axis extending in the z direction of FIG. 3) intersects both the first element and the second element. Likewise, herein the area of the first element that vertically overlaps the second element may be referred to as a vertical overlap area. The size of the vertical overlap area where the first conductive pad 132$a$ vertically overlaps the first transmission line circuit 121$a$ may be configured such that a load reactance value associated with the first transmission line circuit 121$a$ is equal to or less than a predetermined reactance threshold and an absolute value of a difference between a load resistance value associated with the first transmission line circuit 121$a$ and a first resistance value is equal to or less than a predetermined resistance threshold. The predetermined reactance threshold and the predetermined resistance threshold may be very small or even zero values. In other words, the size of the vertical overlap area may be configured such that the load reactance value associated with the first transmission line circuit 121a is substantially zero and the absolute value of the difference between the load resistance value associated with the first transmission line circuit 121a and the first resistance value is substantially zero.

Specifically, as shown in FIG. 3 and FIG. 4, when the first transmission line circuit 121a extends along the y direction, in order to make the first conductive pad 132a at least partially vertically overlap the first transmission line circuit 121a, as compared to the impedance matching device in FIG. 1 and FIG. 2, the length of the first conductive pad 132a in the y direction may be extended in the direction of the first transmission line circuit 121a while keeping the width of the first conductive pad 132a in the x direction unchanged. At the same time, in order to give way to the first conductive pad 132a, as compared to the reference potential layer 131' in FIG. 1 and FIG. 2, the total area of the first reference potential layer 131a is reduced. Accordingly, the length of the first gap 133a between the first reference potential layer 131a and the first conductive pad 132a will be increased compared to the length of the gap 133' in FIG. 1 and FIG. 2.

The increased gap length and the corresponding area of the conductive pad around the gap results in an increase in inductance, which can offset the capacitance in the impedance matching device, so that the reactance component of the load impedance associated with the first transmission line circuit 121a is substantially zero in some embodiments. Moreover, since the length of the first conductive pad 132a is increased while the area of the first reference potential layer 131a is reduced, in general, the resistance component of the load impedance associated with the first transmission line circuit 121a may be maintained at a desired value (e.g., 50 ohms), that is, the absolute value of the change of the resistance component relative to the first resistance value may be substantially zero. In other words, by adjusting the length of the conductive pad to adjust the size of the vertical overlap area between the conductive pad and the corresponding transmission line circuit, it is possible to adjust the reactance component of the load impedance independently from the resistance component, and thus it is possible to easily achieve good impedance matching.

In some embodiments, the initial length and initial width of the first conductive pad 132a may be determined based on the target load resistance value associated with the first transmission line circuit 121a and the first resistance value of the first matching load 134a. For example, the initial length and initial width of the first conductive pad 132a may be determined to have a minimal impact on the load resistance value associated with the first transmission line circuit 121a, and thus the load resistance value is mainly determined by the first resistance value.

Further, in order to achieve a substantially zero load resistance value, the length of the first conductive pad 132a may be determined to be 3 to 5 times the aforementioned initial length, and the width of the first conductive pad 132a may be kept substantially equal to the initial width of the first conductive pad. Generally, the length of the extended first conductive pad 132a finally determined is at least related to the material and thickness of the first dielectric substrate 110a. In addition, it should be noted that the length of the first conductive pad 132a should be less than a quarter of a center wavelength of an operating frequency band of the impedance matching device so as to avoid interference and cancellation of signals.

In addition, in order to ensure the coupling of the first signal between the first conductive pad 132a and the first reference potential layer 131a so as to ensure the transmission effect of the first signal, the width of the first gap 133a should not be too large. Specifically, the width of the first gap 133a may be less than a quarter of the center wavelength of the operating frequency band of the impedance matching device. For example, in the case that the operation frequency is about 100-800 GHz, the width of the first gap 133a may be less than 1 mm. Alternatively, the width of the first gap 133a may be 0.1 mm to 0.5 mm.

In the specific embodiment shown in FIG. 3 and FIG. 4, the first transmission line circuit 121a basically extends along the y direction. However, it is understandable that the extension direction of the first transmission line circuit 121a may also be changed according to needs. For example, the first transmission line circuit 121a may be curved, etc. In this case, as long as the first conductive pad 132a is set to at least partially vertically overlap the first transmission line circuit 121a and a size of the first reference potential layer 131a is accordingly adjusted, it is possible to adjust the load reactance value substantially independently by adjusting the size of the vertical overlap area in a certain direction.

Further, when there are a plurality of transmission line circuits and corresponding signals in the communication device, a plurality of structures for impedance matching may also be provided in the impedance matching device.

Figure 5:
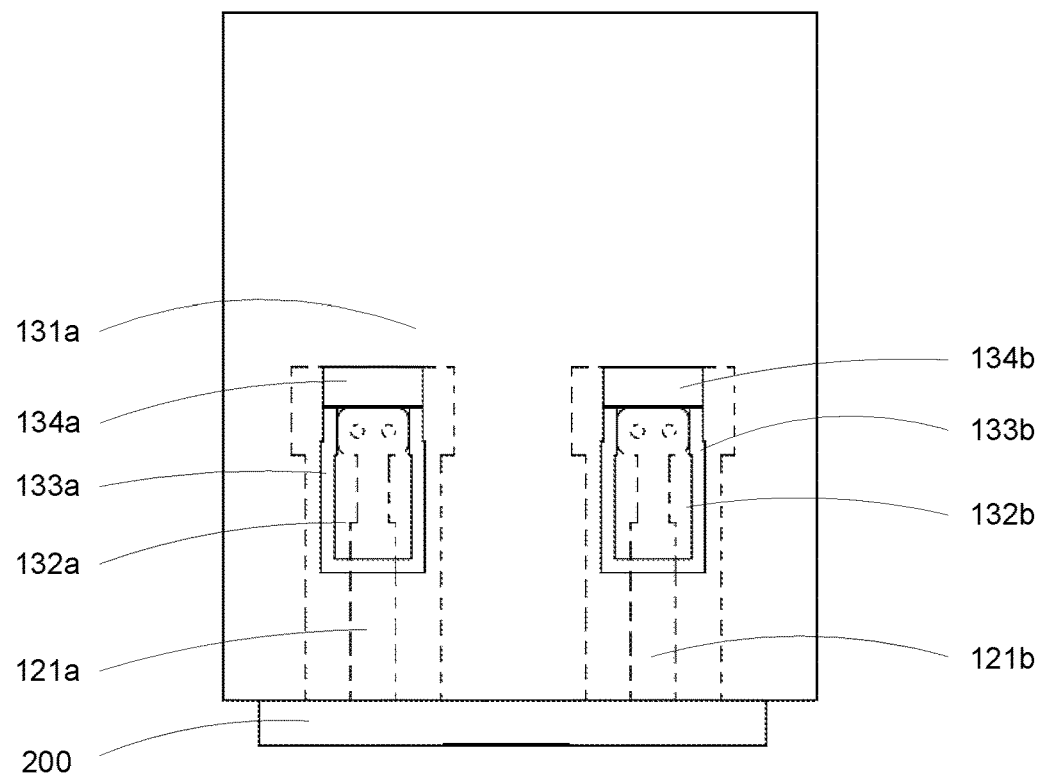
FIG. 5 shows a schematic top view of a communication device according to a second exemplary embodiment of the present disclosure.

In a second exemplary embodiment of the present disclosure, as shown in FIG. 5, the impedance matching device may further include a second transmission line circuit 121b provided on the first side of the first dielectric substrate 110a and a second conductive pad 132b provided on the second side of the first dielectric substrate 110a. A second signal from the source device 200 (or another source device different from the source device 200) may enter the impedance matching device from a first end of the second transmission line circuit 121b and pass through the corresponding conductive through hole in the first dielectric substrate 110a and the second conductive pad 132b on the second side of the first dielectric substrate 110a to be connected to a second matching load 134b that may have a second resistance value. A second gap 133b may be provided between the second conductive pad 132b and the first reference potential layer 131a to prevent the second conductive pad 132b from being short-circuited with the first reference potential layer 131a.

In order to achieve impedance matching, the second conductive pad 132b may be arranged similarly to the first conductive pad 132a. That is, the second conductive pad 132b may extend toward the second transmission line circuit 121b on the second side of the first dielectric substrate 110a so as to at least partially vertically overlap the second transmission line circuit 121b in the normal direction, where the size of a second vertical overlap area where the second conductive pad 132b vertically overlaps the second transmission line circuit 121b is configured such that a load reactance value associated with the second transmission line circuit 121b is equal to or less than the predetermined reactance threshold and an absolute value of a difference between a load resistance value associated with the second transmission line circuit 121b and the second resistance value is equal to or less than a predetermined resistance threshold. In some embodiments, the predetermined reactance threshold and the predetermined resistance threshold may be very small or even zero values. In other words, the size of the second vertical overlap area may be configured such that the load reactance value associated with the second transmission line circuit 121b is substantially zero and the absolute value of the difference between the load resistance value associated with the second transmission line circuit 121b and the second resistance value is substantially zero. It can be understood that parameters such as the positions and sizes of the second conductive pad 132b and the second gap 133b may be set with reference to the corresponding parameters of the first conductive pad 132a and the first gap 133a. In addition, in order to avoid mutual interference between the first signal and the second signal, the minimum distance between the aforementioned structures for impedance matching should be greater or equal to the minimum line width in the impedance matching device in general.

Figure 6:
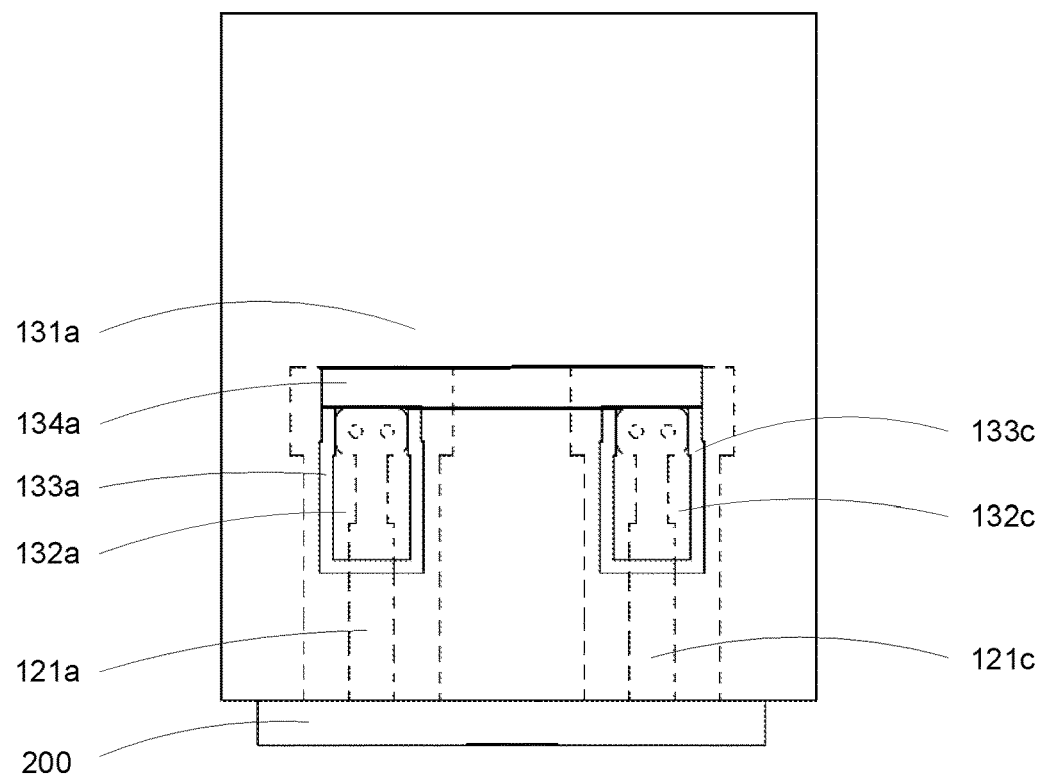
FIG. 6 shows a schematic top view of a communication device according to a third exemplary embodiment of the present disclosure.

In a third exemplary embodiment of the present disclosure, different conductive pads on the second side of the first dielectric substrate may also share the same matching load. As shown in FIG. 6, the impedance matching device may further include a third transmission line circuit 121c that is provided on the first side of the first dielectric substrate 110a and a third conductive pad 132c that is provided on the second side of the first dielectric substrate 110a. A first end of the third transmission line circuit 121 may receive a third signal from the source device 200 (or another source device different from the source device 200), and the third signal is connected to the first matching load 134a via the corresponding conductive through hole in the first dielectric substrate 110a and the third conductive pad 132c on the second side of the first dielectric substrate 110a. There may be a third gap 133c between the third conductive pad 132c and the first reference potential layer 131a to prevent the third conductive pad 132c from being short-circuited with the first reference potential layer 131a.

In order to achieve impedance matching, the third conductive pad 132c may be arranged similarly to the first conductive pad 132a, that is, the third conductive pad 132c may extend toward the third transmission line circuit 121c on the second side of the first dielectric substrate 110a so as to at least partially vertically overlap the third transmission line circuit 121c in the normal direction. The size of a third vertical overlap area where the third conductive pad 132c vertically overlaps the third transmission line circuit 121c may be configured such that a load reactance value associated with the third transmission line circuit 121c is equal to or less than a predetermined reactance threshold and an absolute value of a difference between a load resistance value associated with the third transmission line circuit 121c and the first resistance value of the first matching load 134a is equal to or less than a predetermined resistance threshold. In some embodiments, the predetermined reactance threshold and the predetermined resistance threshold may be very small or even zero values. In other words, the size of the third vertical overlap area may be configured such that the load reactance value associated with the third transmission line circuit 121c is substantially zero and the absolute value of the difference between the load resistance value associated with the third transmission line circuit 121c and the first resistance value is substantially zero. It can be understood that parameters such as the positions and sizes of the third conductive pad 132c and the third gap 133c may be set with reference to the corresponding parameters of the first conductive pad 132a and the first gap 133a. In addition, in order to avoid mutual interference between the first signal and the third signal, the minimum distance between the aforementioned structures for impedance matching should be greater or equal to the minimum line width in the impedance matching device in general.

Figure 7:
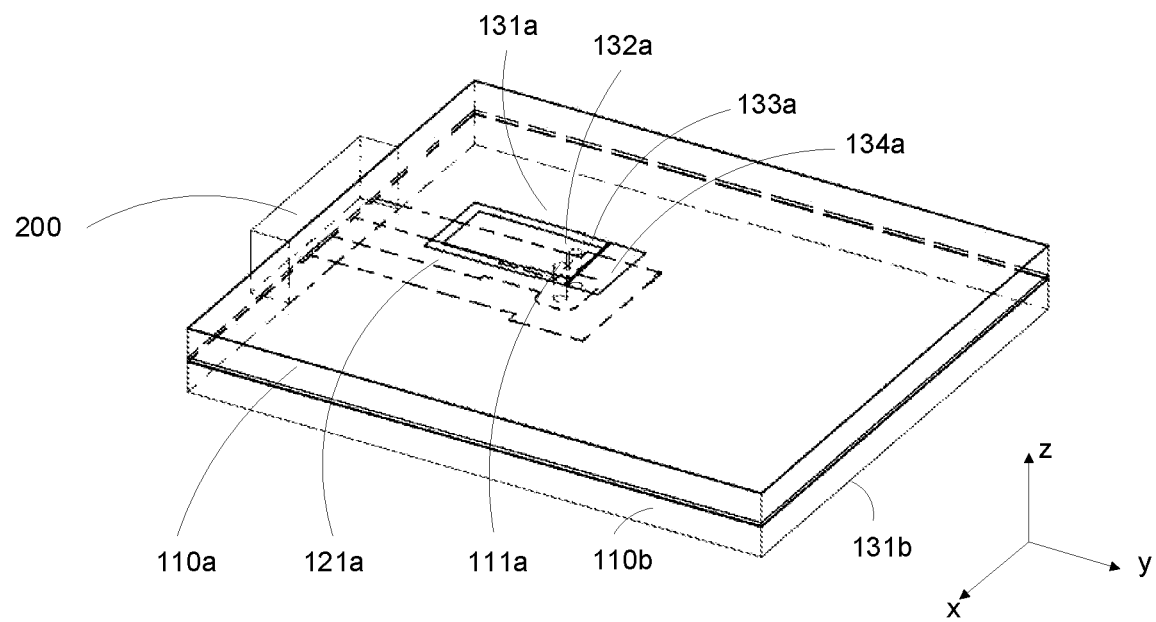
FIG. 7 shows a schematic perspective view of a communication device according to a fourth exemplary embodiment of the present disclosure.

In a fourth exemplary embodiment of the present disclosure, the impedance matching device may further include a multilayered printed circuit board. As shown in FIG. 7, the impedance matching device may further include a second dielectric substrate 110b and a second reference potential layer 131b. A second side of the second dielectric substrate 110b is provided facing the first side of the first dielectric substrate 110a, and the first transmission line circuit 121a may be located between the first dielectric substrate 110a and the second dielectric substrate 110b. In addition, the second reference potential layer 131b may be provided on a first side opposite to the second side of the second dielectric substrate 110b so that the first transmission line circuit 121a may have a stripline transmission line structure. In some embodiments, the second reference potential layer 131b may completely cover the first side of the second dielectric substrate 110b.

Further, the first reference potential layer 131a and the second reference potential layer 131b may be connected through a plurality of conductive through holes (not shown) that are arranged around the first transmission line circuit 121a, so that the first reference potential layer 131a and the second reference potential layer 131b are connected to the same place. In addition, the conductive through holes surrounding the first transmission line circuit 121a can help confine the signals to the area near the first transmission line circuit 121a to achieve better signal transmission. In other words, the first transmission line circuit 121a may have a grounded coplanar waveguide structure in some embodiments.

Figure 8:
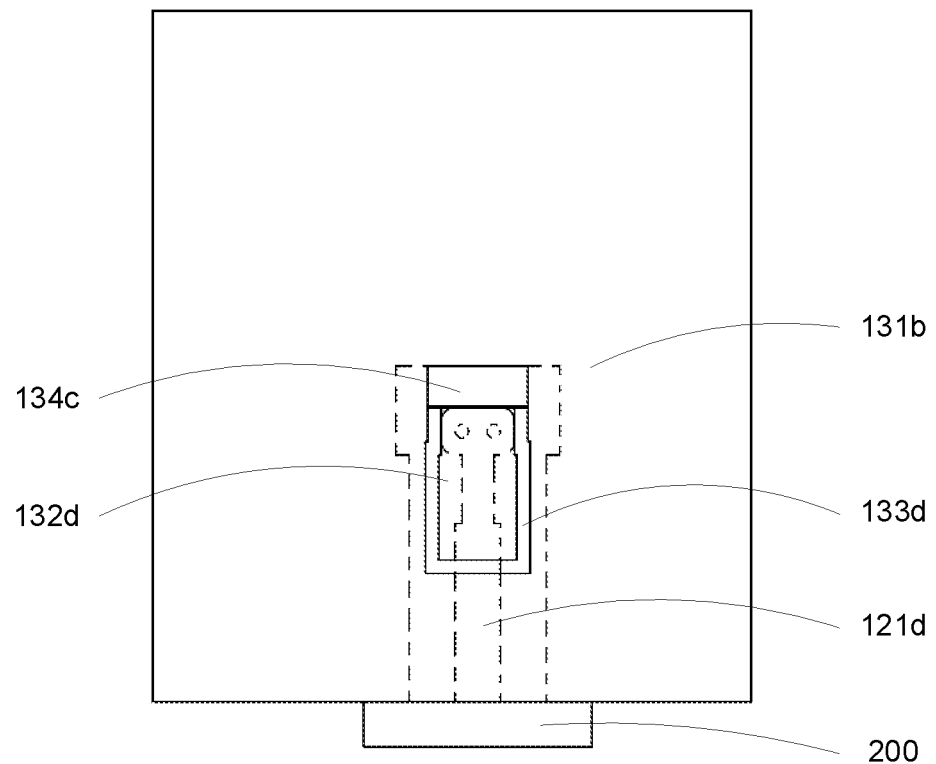
FIG. 8 shows a schematic top view of a communication device according to a fifth exemplary embodiment of the present disclosure.

Further, in a fifth exemplary embodiment of the present disclosure, any of the above-described exemplary embodiments may be modified to have a similar structure for impedance matching provided on the first side of the second dielectric substrate 110b. Specifically, as shown in FIG. 8, the impedance matching device may further include a fourth transmission line circuit 121d provided between the first dielectric substrate 110a and the second dielectric substrate 110b (or on the second side of the second dielectric substrate 110b) and a fourth conductive pad 132d provided on the first side of the second dielectric substrate 110b. The fourth transmission line circuit 121d may receive a fourth signal from the source device 200 (or another source device different from the source device 200), and the fourth signal may be transmitted to the third matching load 134c via the fourth transmission line circuit 121d, the corresponding conductive through hole in the second dielectric substrate 110b, and the fourth conductive pad 132d. In order to avoid shorting, a fourth gap 133d may exist between the second reference potential layer 131b and the fourth conductive pad 132d.

In order to achieve impedance matching, the fourth conductive pad 132d extends toward the fourth transmission line circuit 121d on the first side of the second dielectric substrate 110b so as to at least partially vertically overlap the fourth transmission line circuit 121d in the normal direction. Here, the size of a fourth vertical overlap area where the fourth conductive pad 132d vertically overlaps the fourth transmission line circuit 121d is configured such that a load reactance value associated with the fourth transmission line circuit 121d is equal to or less than a predetermined reactance threshold and an absolute value of a difference between a load resistance value associated with the fourth transmission line circuit 121d and the third resistance value of the third matching load 134c is equal to or less than a predetermined resistance threshold. In some embodiments, the predetermined reactance threshold and the predetermined resistance threshold may be very small or even zero values. In other words, the size of the fourth vertical overlap area may be configured such that the load reactance value associated with the fourth transmission line circuit 121d is substantially zero and the absolute value of the difference between the load resistance value associated with the fourth transmission line circuit 121d and the third resistance value is substantially zero. It can be understood that parameters such as the positions and sizes of the fourth conductive pad 132d and the fourth gap 133d may be set with reference to the corresponding parameters of the first conductive pad 132a and the first gap 133a.

In some other embodiments of the present disclosure, the impedance matching device may further include more dielectric substrates and corresponding transmission line circuits, reference potential layers, etc. In order to achieve better impedance matching, a conductive pad having an extended length may be provided in every reference potential layer corresponding to a transmission line circuit so as to adjust the reactance component substantially independently from the resistance component of the load impedance.

The present disclosure further proposes a communication device, which may include the impedance matching device as described above. The communication device may be any device that can be connected to the load at a terminal, for example, a transmission line circuit, a coupler, a calibration board, etc.

As used herein, the words "front," "rear," "top," "bottom," "above," "below," etc., if present, are used for descriptive purposes and are not necessarily used to describe constant relative positions. It should be understood that the terms used in this way are interchangeable under appropriate circumstances, so that the embodiments of the present disclosure described herein, for example, can be operated on other orientations that differ from those orientations shown herein or otherwise described.

As used herein, the word "exemplary" means "serving as an example, instance, or illustration" rather than as a "model" to be copied exactly. Any realization method described exemplarily herein is not necessarily interpreted as being preferable or advantageous over other realization methods. Furthermore, the present disclosure is not limited by any expressed or implied theory given in the above technical field, background art, summary of the invention or embodiments.

As used herein, the word "basically" means any minor changes including those caused by design or manufacturing defects, device or component tolerances, environmental influences, and/or other factors. The word "basically" also allows the gap from the perfect or ideal situation due to parasitic effects, noise, and other practical considerations that may be present in the actual realization.

In addition, the above description may have mentioned elements or nodes or features that are "connected" or "coupled" together. As used herein, unless explicitly stated otherwise, "connect" means that an element/node/feature is electrically, mechanically, logically, or in other manners connected (or communicated) with another element/node/feature. Similarly, unless explicitly stated otherwise, "coupled" means that one element/node/feature can be mechanically, electrically, logically or otherwise connected with another element/node/feature in a direct or indirect manner to allow interaction, even though the two features may not be directly connected. That is, "coupled" is intended to comprise direct and indirect connection of components or other features, including connection using one or a plurality of intermediate components.

In addition, for reference purposes only, "first," "second" and similar terms may also be used herein, and thus are not intended to be limitative. For example, unless the context clearly indicates, the words "first," "second" and other such numerical words involving structures or elements do not imply a sequence or order.

It should also be noted that, as used herein, the words "include/comprise," "contain," "have," and any other variations indicate that the mentioned features, entireties, steps, operations, elements and/or components are present, but do not exclude the presence or addition of one or a plurality of other features, entireties, steps, operations, elements, components and/or combinations thereof.

In the present disclosure, the term "provide" is used in a broad sense to cover all ways of obtaining an object, so "providing an object" includes but is not limited to "purchase," "preparation/manufacturing," "arrangement/setting," "installation/assembly," and/or "order" of the object, etc.

Those skilled in the art should realize that the boundaries between the above operations are merely illustrative. A plurality of operations can be combined into a single operation, which may be distributed in the additional operation, and the operations can be executed at least partially overlapping in time. Also, alternative embodiments may include a plurality of instances of specific operations, and the order of operations may be changed in various other embodiments. However, other modifications, changes and substitutions are also possible. Therefore, the Specification and attached drawings hereof should be regarded as illustrative rather than restrictive.

Although some specific embodiments of the present disclosure have been described in detail through examples, those skilled in the art should understand that the above examples are only for illustration rather than for limiting the scope of the present disclosure. The embodiments disclosed herein can be combined arbitrarily without departing from the spirit and scope of the present disclosure. Those skilled in the art should also understand that various modifications can be made to the embodiments without departing from the scope and spirit of the present disclosure. The scope of the present disclosure is defined by the attached claims.

That which is claimed is:

1. An impedance matching device, including:
   a first dielectric substrate;
   a first transmission line circuit, which is provided on a first side of the first dielectric substrate, a first end of the first transmission line circuit being configured to receive a first signal;
   a first conductive pad, which is electrically connected to a second end of the first transmission line circuit and extends toward the first transmission line circuit on a second side opposite the first side of the first dielectric substrate so as to at least partially vertically overlap the first transmission line circuit;
   a first reference potential layer, which is provided on the second side of the first dielectric substrate and separated from the first conductive pad by a first gap; and
   a first matching load, which is electrically connected to the first conductive pad and has a first resistance value;
   wherein a first vertical overlap area where the first conductive pad vertically overlaps the first transmission line circuit is configured so that an inductance of the first gap substantially offsets a capacitance between the signal transmission line circuit and the first reference potential layer.

2. The impedance matching device according to claim 1, wherein the impedance matching device further includes:
a second dielectric substrate, a second side of the second dielectric substrate being provided facing the first side of the first dielectric substrate, and the first transmission line circuit being located between the first dielectric substrate and the second dielectric substrate; and
a second reference potential layer, which is provided on a first side opposite to the second side of the second dielectric substrate.

3. The impedance matching device according to claim 2, wherein the impedance matching device further includes:
a fourth transmission line circuit, which is provided between the first dielectric substrate and the second dielectric substrate, a first end of the fourth transmission line circuit being configured to receive a fourth signal;
a fourth conductive pad, which is electrically connected to a second end of the fourth transmission line circuit and extends toward the fourth transmission line circuit on the second side of the second dielectric substrate so as to at least partially vertically overlap the fourth transmission line circuit, a fourth gap being between the fourth conductive pad and the second reference potential layer to prevent the fourth conductive pad from being short-circuited with the second reference potential layer; and
a third matching load, which is electrically connected to the fourth conductive pad and has a third resistance value;
wherein a fourth vertical overlap area where the fourth conductive pad overlaps the fourth transmission line circuit has a size configured such that a load reactance value associated with the fourth transmission line circuit is equal to or less than the predetermined reactance threshold and an absolute value of a difference between a load resistance value associated with the fourth transmission line circuit and the third resistance value is equal to or less than the predetermined resistance threshold.

4. The impedance matching device according to claim 3, wherein the size of the fourth vertical overlap area is configured such that the load reactance value associated with the fourth transmission line circuit is substantially zero; and
the size of the vertical fourth overlap area is configured such that the absolute value of the difference between the load resistance value associated with the fourth transmission line circuit and the third resistance value is substantially zero.

5. The impedance matching device according to claim 1, wherein the impedance matching device further includes:
a second transmission line circuit, which is provided on the first side of the first dielectric substrate, a first end of the second transmission line circuit being configured to receive a second signal;
a second conductive pad, which is electrically connected to a second end of the second transmission line circuit and extends toward the second transmission line circuit on the second side of the first dielectric substrate so as to at least partially vertically overlap the second transmission line circuit, a second gap being between the second conductive pad and the first reference potential layer to prevent the second conductive pad from being short-circuited with the first reference potential layer; and a second matching load, which is electrically connected to the second conductive pad and has a second resistance value;
wherein a second vertical overlap area where the second conductive pad vertically overlaps the second transmission line circuit has a size configured such that a load reactance value associated with the second transmission line circuit is equal to or less than the predetermined reactance threshold and an absolute value of a difference between a load resistance value associated with the second transmission line circuit and the second resistance value is equal to or less than the predetermined resistance threshold.

6. The impedance matching device according to claim 5, wherein the size of the second vertical overlap area is configured such that the load reactance value associated with the second transmission line circuit is substantially zero; and
the size of the second vertical overlap area is configured such that the absolute value of the difference between the load resistance value associated with the second transmission line circuit and the second resistance value is substantially zero.

7. The impedance matching device according to claim 1, wherein the size of the first vertical overlap area is configured such that the load reactance value associated with the first transmission line circuit is substantially zero; and
the size of the first vertical overlap area is configured such that the absolute value of the difference between the load resistance value associated with the first transmission line circuit and the first resistance value is substantially zero.

8. The impedance matching device according to claim 1, wherein the impedance matching device further includes a conductive through hole provided in the first dielectric substrate, and the second end of the first transmission line circuit is connected to the first conductive pad through the conductive through hole.

9. The impedance matching device according to claim 1, wherein the first reference potential layer covers all areas on the second side of the first dielectric substrate except for areas occupied by the first conductive pad, the first gap, and the first matching load.

10. The impedance matching device according to claim 1, wherein the first reference potential layer is arranged around the first conductive pad and the first matching load.

11. The impedance matching device according to claim 1, wherein the first matching load includes a first matching resistor connected between the first conductive pad and the first reference potential layer.

12. The impedance matching device according to claim 1, wherein a width of the first gap is less than a quarter of the center wavelength of the operating frequency band of the impedance matching device.

13. The impedance matching device according to claim 1, wherein the width of the first gap is less than 1 mm.

14. The impedance matching device according to claim 1, wherein the width of the first gap is 0.1 mm to 0.5 mm.

15. An impedance matching device, including:
a first dielectric substrate;
a first transmission line circuit, which is provided on a first side of the first dielectric substrate, a first end of the first transmission line circuit being configured to receive a first signal;
a first conductive pad, which is electrically connected to a second end of the first transmission line circuit and extends toward the first transmission line circuit on a second side opposite the first side of the first dielectric substrate so as to at least partially vertically overlap the first transmission line circuit;

a first reference potential layer, which is provided on the second side of the first dielectric substrate and separated from the first conductive pad by a first gap; and a first matching load, which is electrically connected to the first conductive pad and has a first resistance value;

wherein the first gap has a substantially constant width and an inductive effect of the first gap is configured to substantially offset a capacitance between the signal transmission line circuit and the first reference potential layer.

16. The impedance matching device according to claim 15, wherein the first matching load comprises a first matching resistor connected between the first conductive pad and the first reference potential layer.

17. The impedance matching device according to claim 15, wherein a first vertical overlap area where the first conductive pad vertically overlaps the first transmission line circuit is configured to add an inductance that substantially offsets a capacitance between the signal transmission line circuit and the first reference potential layer.

18. An impedance matching device, including:
a first dielectric substrate;
a first transmission line circuit, which is provided on a first side of the first dielectric substrate, a first end of the first transmission line circuit being configured to receive a first signal;
a first conductive pad, which is electrically connected to a second end of the first transmission line circuit and extends toward the first transmission line circuit on a second side opposite the first side of the first dielectric substrate so as to at least partially vertically overlap the first transmission line circuit;
a first reference potential layer, which is provided on the second side of the first dielectric substrate and separated from the first conductive pad by a first gap; and
a first matching load, which is electrically connected to the first conductive pad and has a first resistance value;
wherein a first vertical overlap area where the first conductive pad vertically overlaps the first transmission line circuit has a size configured such that a load reactance value associated with the first transmission line circuit is equal to or less than a predetermined reactance threshold and an absolute value of a difference between a load resistance value associated with the first transmission line circuit and the first resistance value is equal to or less than a predetermined resistance threshold, wherein the impedance matching device further includes:
a third transmission line circuit, which is provided on the first side of the first dielectric substrate, a first end of the third transmission line circuit being configured to receive a third signal;
a third conductive pad, which is electrically connected to a second end of the third transmission line circuit and extends toward the third transmission line circuit on the second side of the first dielectric substrate so as to at least partially vertically overlap the third transmission line circuit, a third gap being between the third conductive pad and the first reference potential layer to prevent the third conductive pad from being short-circuited with the first reference potential layer, the third conductive pad being electrically connected to the first matching load;
wherein a third vertical overlap area where the third conductive pad vertically overlaps the third transmission line circuit has a size configured such that a load reactance value associated with the third transmission line circuit is equal to or less than the predetermined reactance threshold and an absolute value of a difference between a load resistance value associated with the third transmission line circuit and the first resistance value is equal to or less than the predetermined resistance threshold.

19. The impedance matching device according to claim 18, wherein the size of the third vertical overlap area is configured such that the load reactance value associated with the third transmission line circuit is substantially zero; and
the size of the third vertical overlap area is configured such that the absolute value of the difference between the load resistance value associated with the third transmission line circuit and the first resistance value is substantially zero.

* * * * *